US006239045B1

(12) United States Patent
Tanaka et al.

(10) Patent No.: US 6,239,045 B1
(45) Date of Patent: May 29, 2001

(54) SEMICONDUCTOR PRODUCING APPARATUS AND PRODUCING METHOD FOR EPITAXIAL WAFER USING SAME

(75) Inventors: Norimichi Tanaka; Yutaka Ota, both of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/332,090

(22) Filed: Jun. 14, 1999

(30) Foreign Application Priority Data

Jul. 7, 1998 (JP) ............................. 10-208608

(51) Int. Cl.[7] .................................. H01L 21/00

(52) U.S. Cl. ........................... 438/905; 438/905

(58) Field of Search .................. 438/695, 706, 438/734, 913, 905, 680, 773, 745, 764

(56) References Cited

U.S. PATENT DOCUMENTS 5,828,080 * 10/1998 Yano et al. ........................ 257/43
6,008,128 * 12/1999 Habuka et al. .................... 438/695

OTHER PUBLICATIONS

Ohmi, T "A New Single Wafer Cleaning Method Based on the RCA Cleaning Solved Its Mechanism", Nikkei Micordevices, pp. 90–95, Mar. 1997.

* cited by examiner

Primary Examiner—David Nelms
Assistant Examiner—David Nhu
(74) Attorney, Agent, or Firm—Snider & Associates; Ronald R. Snider (57) ABSTRACT

By perfectly preventing a particle from being attached on a silicon wafer or a silicon epitaxial wafer before and after the silicon epitaxial growth, pit formation on the silicon epitaxial layer in RCA cleaning is prevented from occurring. A pretreatment chamber, a vapor phase growth chamber and an aftertreatment chamber are mutually connected by a transport path whose interior is clean while being isolated from the outside environment. In the pretreatment chamber, megasonic cleaning using $O_3$ added water is conducted (step S2); in the vapor growth chamber, removal of a chemical silicon oxide film C by pre-bake (step S4) and formation of a high quality silicon epitaxial layer E are conducted (step S5); and in the aftertreatment chamber, passivation of the silicon epitaxial layer E is conducted by $O_3$ water cleaning or SC1 cleaning (step S7). Since a wafer surface is always covered by the chemical silicon oxide film C in transportation after formation of the silicon epitaxial layer E, direct attachment of fine metal particles M which each are a cause of pit formation is prevented from occurring.

5 Claims, 6 Drawing Sheets

SEMICONDUCTOR PRODUCING APPARATUS AND PRODUCING METHOD FOR EPITAXIAL WAFER USING SAME

RELATED APPLICATION

This application claims the priority of Japanese Patent Application No. 10-208608 filed on Jul. 7, 1998, which is incorporated herein by reference.

BACKGROUND OF THE INVENTION

1. Field of the Invention

This invention relates to a semiconductor producing apparatus which is used for production of a silicon epitaxial wafer and a producing method for a epitaxial wafer using the apparatus and particularly, to a technique by which an epitaxial layer with a high quality is obtained, and in which a fine particle is thoroughly prevented from being attached to a wafer before and after epitaxial growth.

2. Description of the Related Art

In company with a dramatic improvement in semiconductor integrated circuit toward finer designing and higher integration, there have arisen demands, in regard to a silicon wafer surface which has come to be processed in a subquarter micron rule, that the number of fine particles with a size of the order of 0.1 $\mu$m attached on the surface is limited to less than 100 particles/cm$^2$ and a flatness thereof is of the atomic order.

Along with this trend, it is expected that there will be a progressively increased demand for a silicon epitaxial wafer, as a future silicon wafer, which is prepared by growing a thin film of a silicon single crystal in vapor phase growth on a surface of a silicon single crystal substrate whose surface is mirror-polished. The reason why is that in a recent semiconductor device in which an electric charge to be handled is reduced according to finer designing, there will arise a larger probability that a minute defect in the vicinity of a silicon wafer surface acts a fatal influence on device characteristics more strongly in the future than now, whereas a silicon wafer which is produced by slicing a silicon single crystal ingot pulled from a melt to obtain a wafer and further mirror-polishing the wafer has difficulty in sufficiently decreasing minute defects which are inherited from the crystal ingot.

In production of a silicon epitaxial wafer, it is especially important to eliminate fine particles from a wafer surface before and after epitaxial growth.

Attachment of a fine particle on a wafer surface before the epitaxial growth has a direct influence on a film quality of a silicon epitaxial layer formed on the surface. A stacking fault and a projected defect which are formed in a silicon epitaxial layer are typical examples to evidence the importance.

Heretofore, elimination of fine particles has been effected by cleaning and the so-called RCA cleaning method which was proposed in the 1970s has especially widely been used so far with many improvements made therein over time.

The RCA cleaning method includes composite methods in which three kinds of fundamental cleaning are combined in various ways according to the purposes of cleaning, wherein the three kinds of fundamental cleaning are: cleaning (SC1 cleaning) by an ammonia-hydrogen peroxide mixed solution for eliminating fine silicon based particles by taking advantage of electrostatic repulsion in an alkali solution between a fine silicon based particle which is generally called particle and a wafer; cleaning (SC2 cleaning) by a hydrochloric acid-hydrogen peroxide mixed solution for eliminating a fine metal particle through ionization thereof; and cleaning by a dilute hydrofluoric acid solution (DHF) for eliminating a natural oxide film on a silicon surface. In addition to the three kinds of fundamental cleaning, cleaning by a sulfuric acid-hydrogen peroxide mixed solution for eliminating a metal and an organic material is sometimes combined as a fourth kind of cleaning if necessary.

Figure 6:
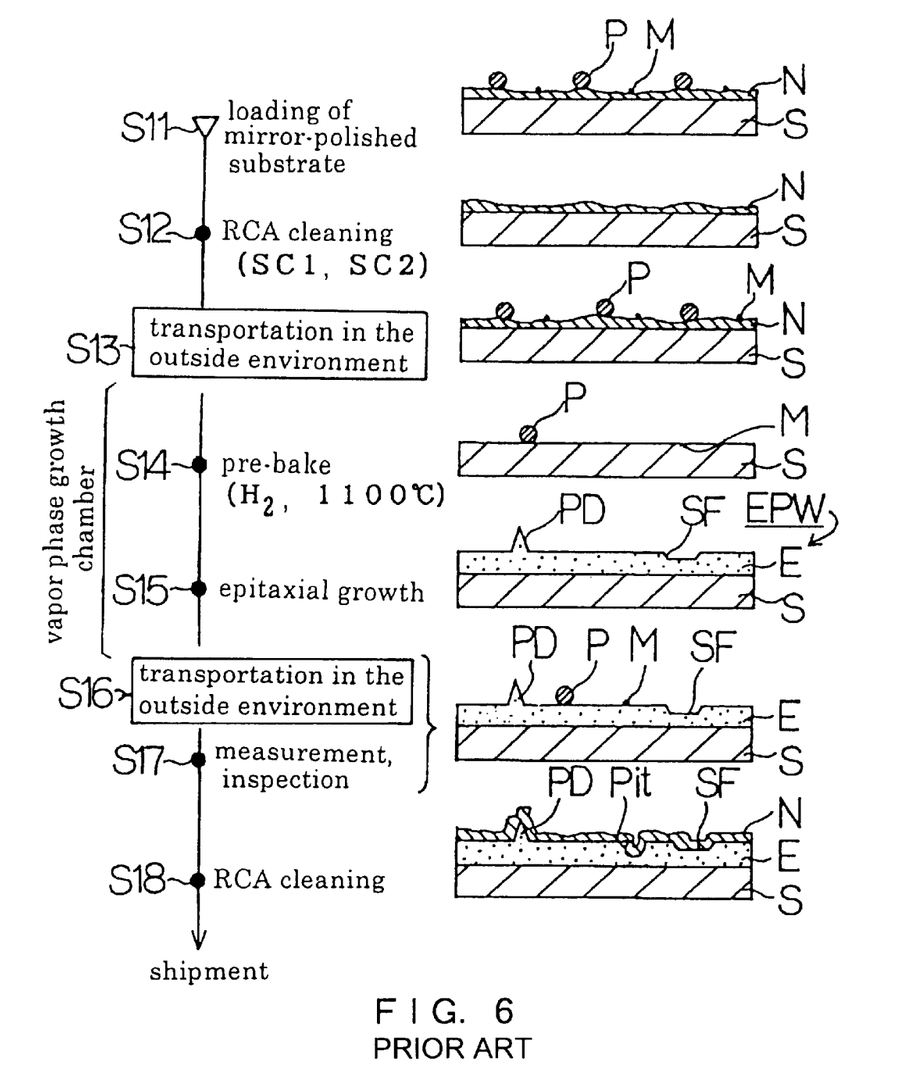
FIG. 6 is a flow chart showing a fundamental procedure of a conventional producing method for an epitaxial wafer.

A general flow of production of a silicon epitaxial wafer is shown in FIG. 6.

In step S11, first, a silicon single crystal substrate S on which a natural oxide film is formed after mirror-polishing is loaded into a cleaning apparatus. Fine silicon based particles P and fine metal particles M which are generally called as particles are attached on the silicon single crystal substrate S with the natural oxide film interposed therebetween.

In step S12, the attached particles are eliminated by RCA cleaning in which the SC1 cleaning and the SC2 cleaning are conducted in this order.

Then, in step S13, the silicon single crystal substrate S is taken out to the outside of the cleaning apparatus and transported to a vapor phase growth chamber. During the transportation, some of fine silicon based particles P and fine metal particles M are unavoidably attached on the substrate S.

In step S14, the silicon single crystal substrate S with which has been loaded into the vapor phase growth chamber is first subjected to pre-bake as a preliminary heat treatment. The pre-bake is conducted in order to remove the natural oxide film N, foreign matter attached to the surface such as fine silicon based particles P and fine metal particles M and the like wherein a heat treatment is conducted at a temperature of 1100° C. or higher in an $H_2$ atmosphere.

Subsequently, in step S15 epitaxial growth is conducted to form a silicon epitaxial layer E.

Instep S16, thus obtained epitaxial wafer EPW is unloaded from the vapor phase growth chamber and transported to a measurement/inspection step of step S17. In step S17, thickness measurement, flatness measurement and visual inspection are performed, for example.

An epitaxial wafer EPW which has passed the measurements and inspection is shipped after being subjected to RCA cleaning in step S18 which follows the step S17.

However, after the cleaning in step S12 and after the epitaxial growth in step S15 in the above described production flow, since the silicon single crystal substrate S or the epitaxial wafer EPW is transported in the atmosphere outside an apparatus or a chamber, some kind of contamination has a chance to occur.

For example, in step S13, large amounts of fine silicon based particles P and fine metal particles M are attached on the silicon single crystal substrate S. If, in pre-bake of step S14, the particles cannot sufficiently be removed, a flatness of the surface of the silicon epitaxial layer E which is grown in step S15 is degraded since projected defects PD occur on the surface thereof, or stacking faults SF arise in the interior thereof.

Since an epitaxial wafer EPW unloaded from a vapor phase growth chamber is generally transported in the outside atmosphere to provide for measurement and inspection in step S17, during the transportation there is a chance that fine silicon based particles P and fine metal particles M are attached to the surfaces of the silicon epitaxial layer E. The inventors of the invention have discovered that when an oxidation-reduction potential of a fine metal particle M ion is higher than that of silicon (Si) and hydrogen ion (H⁺), a pit having a diameter less than 0.2 μm is formed on the surface of a silicon epitaxial layer E in RCA cleaning in step S18. Gold (Au) and copper (Cu) are typical metals which become a cause of pit formation.

Au is commonly used as material of electrodes and interconnection (or wiring) of a semiconductor integrated circuit. Cu is used, for example, as a material of a high frequency induction heating coil in an epitaxial growth apparatus with a vertical type furnace. In this way, since Au and Cu are always present in a working place for semiconductor device production, fine metal particles M of Au and Cu are floating in the space of a clean room all time.

In production of a silicon epitaxial wafer, a refined producing method has been desired in which a high quality silicon epitaxial layer with neither projected defects nor stacking faults is formed and pits are not formed on the surface thereof after the epitaxial growth.

SUMMARY OF THE INVENTION

It is an object of the invention to provide a semiconductor producing apparatus which can be an effective measure to realize such a desire and a producing method for a epitaxial wafer using the apparatus.

The inventors have discovered the following steps of a production process which the object can be achieved by performing: a mirror-polished wafer before epitaxial growth is cleaned using ozone added water, the wafer after the cleaning is immediately transferred to a silicon epitaxial growth step without exposure to the outside environment and an epitaxial wafer after the epitaxial growth is immediately subjected to passivation with a chemical silicon oxide film without exposure to the outside environment, and the discovery has led to proposal of the invention.

The chemical silicon oxide film described here in the invention means one which is intentionally formed through a chemical reaction, which is different from a natural oxide film.

That is, a semiconductor producing apparatus of the invention has a construction comprising: a pretreatment chamber for cleaning a silicon wafer therein using ozone added water; a vapor phase growth chamber for growing a silicon epitaxial layer on the silicon wafer therein; and an aftertreatment (postepi-treatment) chamber for forming a chemical silicon oxide film on a surface of the silicon epitaxial layer therein, wherein at least chambers adjacent to each other are connected by at least one transport path, whose interior is controlled to have an atmosphere isolated from the outside environment, and through which the silicon wafer is transferred between chambers.

It is especially preferable that the pretreatment chamber is provided with means for applying supersonic vibration to the ozone added water.

It is preferable that the aftertreatment chamber is provided with solution supply means for supplying a solution including an oxidizing agent on a surface of the silicon epitaxial wafer.

In a producing method for an epitaxial wafer using such an apparatus, a surface of a silicon wafer are first cleaned with ozone added water in the pretreatment chamber (first step), the silicon wafer is then transported to a vapor phase growth chamber through a transport path whose interior is controlled to have an atmosphere isolated from the outside environment (second step); a silicon epitaxial layer is grown subsequently on the silicon wafer in the vapor phase growth chamber to obtain an epitaxial wafer (third step), the epitaxial wafer is transported using wafer transfer means equipped in a transport path to the aftertreatment chamber through the transport path whose interior is controlled to have an atmosphere isolated from the outside environment (fourth step) and a chemical silicon oxide film is finally formed on a surface of the epitaxial layer (fifth step).

In the first step, it is especially preferable that the silicon wafer is cleaned with the ozone added water while applying supersonic vibration.

In the fifth step, it is preferable that the chemical silicon oxide film is formed by putting the epitaxial layer into contact with a solution including an oxidizing agent. At this point, ozone added water or an ammonia-hydrogen peroxide mixed solution (a so-called SC1 solution) can be used as the solution.

It is especially preferable that the atmosphere in a transport path is kept at a cleanliness level of class 10 or higher (cleaner).

As can be clear from the above description, according to a semiconductor production apparatus and a producing method for an epitaxial wafer using the apparatus of the invention, since a series of steps: cleaning of a silicon wafer by $O_3$ water cleaning directly before epitaxial growth→epitaxial growth→passivation of a epitaxial wafer directly after epitaxial growth, can continuously be performed in a clean atmosphere which is isolated from the outside environment, a high quality epitaxial layer can be grown under no influence of foreign matter attached on the surface and at the same time, not only second contamination of thus obtained epitaxial wafer but pits caused by the second contamination can be prevented from occurring.

In the $O_3$ water cleaning, removal efficiency of fine particles can be increased by applying supersonic vibration.

In an aftertreatment, by conducting $O_3$ cleaning in the same way as the pretreatment, or the SC1 cleaning, a uniform silicon oxide film can be formed with ease.

According to the invention, high quality silicon epitaxial wafers can be supplied with an excellent yield, uniformity and reproducibility, and with such improvement, practical use of a larger diameter wafer and application of a finer design rule can be realized. Hence the present invention has a great value in industrial applicability.

DETAILED DESCRIPTION OF THE PREFERRED EMBODIMENTS

In the invention, cleaning using ozone added water is conducted before epitaxial growth (hereinafter referred to as $O_3$ water cleaning) and fine silicon based particles P and fine metal particles M attached on the surface of a silicon wafer are eliminated using a strong oxidation effect of $O_3$ before the epitaxial growth.

The principle of the $O_3$ water cleaning is detailed, for example, in NIKKEI MICRO-DEVICE, March 1997, p.90 to 95, published by NIKKEI BP Co. Even when a metal ion whose oxidation-reduction potential is higher than that of $H^+$ such as $Cu^{2+}$ coexists with Si, $O_3$ extracts electrons from the silicon surface on a priority basis. Hence, the metal is in a stable manner kept in a water in an ionized state, while the Si surface is covered with a thin chemical silicon oxide film. The chemical silicon oxide film hinders exchange of electrons between Si and metal ions existing in the neighborhood of the Si and as a result the metal ions are prevented from being attached on the surface of the epitaxial layer as metal particles.

In the invention, since a silicon wafer which has been cleaned in the pretreatment chamber just before the epitaxial growth and covered with such a chemical silicon oxide film is loaded into the vapor phase growth chamber through the transport path whose interior is controlled to have an atmosphere isolated from the outside environment, the silicon wafer is subjected to pre-bake in a state in which foreign matter attached on the surface of the silicon wafer is very small in quantity and a clean surface of the silicon wafer is revealed. Accordingly, a high quality silicon epitaxial layer with neither stacking faults nor projected defects is formed in epitaxial growth following the pre-bake.

Since thus obtained epitaxial wafer is loaded into the aftertreatment chamber through the transport path whose interior is controlled to have an atmosphere isolated from the outside environment directly after the epitaxial growth, the epitaxial wafer, too, is immediately covered with a chemical silicon oxide film in a state in which the foreign matter attached on the surface of the epitaxial wafer is very small in quantity. If the surface of an epitaxial layer is once covered with a chemical silicon oxide film in this way, the epitaxial layer is not contaminated anymore even when the epitaxial wafer is left in a clean room for more or less of a time period.

If attachment of fine metal particles on a highly active Si surface is prevented by such a chemical silicon oxide film, there occur no oxidation of a Si surface in the vicinity of a fine metal particle and therefore, no pit with a diameter equal to or more than 0.1 $\mu$m is formed at a site where a fine metal particle is attached even when RCA cleaning is conducted. Thus, a silicon epitaxial wafer can be provided which is most suitable for a next generation semiconductor process with a design rule down to 0.1 $\mu$m.

The epitaxial wafer is transported through the outside atmosphere to a next step in a state in which the epitaxial wafer is covered by a chemical silicon oxide film. The next step to be imagined here is typically a step for thickness measurement, flatness measurement and visual inspection.

In an actual working place for semiconductor production, since a tact time for each step is different from another, a waiting time before being transported into a next step has a chance to become very long according to a wafer in a particular step. The invention is very effective for prevention of contamination of an epitaxial wafer in such a case.

The chemical silicon oxide film on the epitaxial layer can be formed by being cleaned with the $O_3$ water like the pretreatment or by a SC1 cleaning. That is, a cleaning operation which has in general exclusively been used for eliminating fine particles as a traditional way is utilized as means for passivation. A chemical silicon oxide film formed by these methods is uniform and very thin in thickness, which is different from a natural oxide film. A film thickness is sufficiently in the range of 0.3 to 1 nm at most.

However, since the SC1 cleaning has no action to eliminating metal ions, the SC2 cleaning by which metal ions can be eliminated is desirably combined with the SC1 when a chemical oxide film is formed by the SC1 cleaning.

On the other hand, the $O_3$ water cleaning can also eliminate organic attachment and $CO_2$ and $O_2$ are produced through decomposition of the organic attachment. Besides, there can be enjoyed merits that requirement for ultrapure water in rinse is small in quantity and load on air conditioning for a clean room is alleviated.

As a preparing method for $O_3$ added water, for example, there are available a method in which $O_3$ produced in electrolysis of ultrapure water or AC silent discharge in $O_2$ gas is introduced into ultrapure water through a gas permeable membrane or by bubbling, and a method in which ultrapure water with dissolved oxygen therein is irradiated with ultraviolet to directly produce $O_3$ in the water.

The $O_3$ added water may be applied with supersonic vibration, which is especially more effective in $O_3$ water cleaning before epitaxial growth. Needless to say, of course, that supersonic vibration can adopt in combination when a chemical silicon oxide film is formed in $O_3$ water cleaning after epitaxial growth.

A frequency of supersonic vibration may be set in the range of general use. However, a size of a particle which can be eliminated is changeable being dependent on a frequency. In a comparative low frequency range equal to or less than about 100 kHz, a comparative large sized fine particle with a diameter of 10 $\mu$m or more can be peeled off by an action of cavitation (minute cavity) generated in the interior of a cleaning solution mass. On the other hand, in a high frequency range of the so-called magasonic of 500 kHz, 1 MHz or more, a fine particle of a diameter of 2 $\mu$m or less can also be removed by impact of a shock wave on a epitaxial wafer which is generated in company with propagation of vibration in the cleaning solution.

EXAMPLES

Example 1

In the example, there will be described with reference to FIGS. 1, 2 a construction of an apparatus, as an example of a semiconductor producing apparatus of the invention, in which a pretreatment chamber, a vapor phase growth chamber and an aftertreatment chamber are aligned in in-line arrangement with transport paths respectively interposed therebetween.

Figure 1:
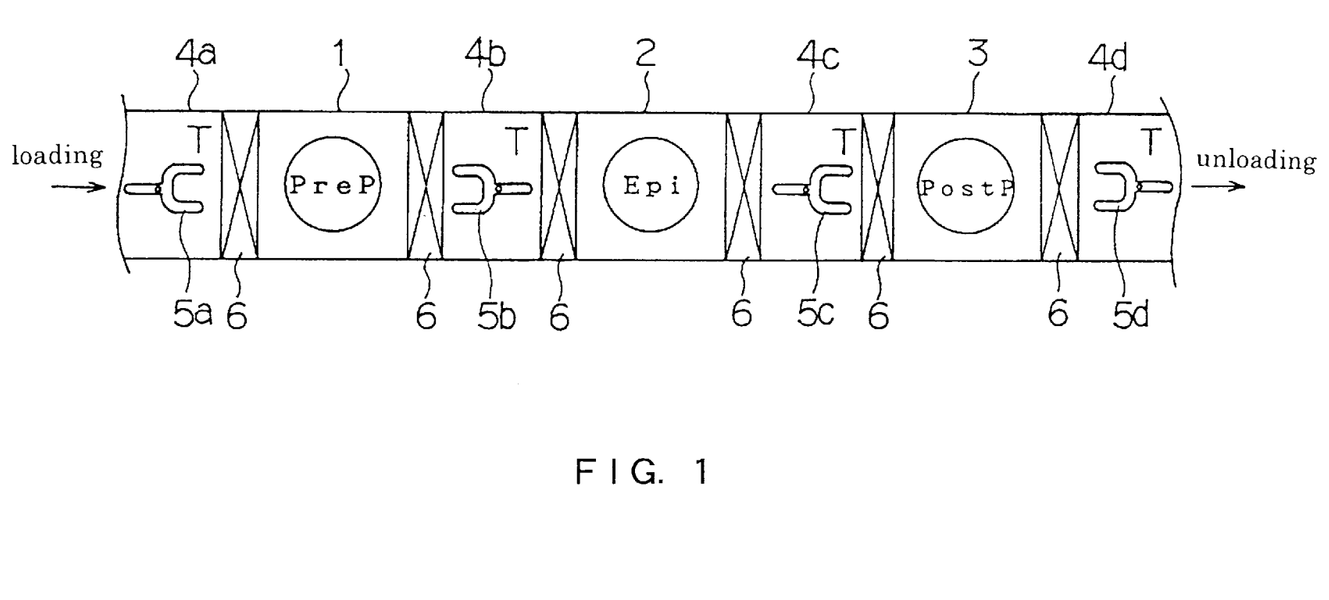
FIG. 1 is a schematic plan view showing a construction example of a semiconductor producing apparatus of the invention in which a pretreatment chamber, a vapor phase growth chamber and an aftertreatment chamber are aligned in in-line arrangement with transport paths interposed therebetween.

In the construction of FIG. 1, a transport path (T) 4a, a pretreatment chamber (PreP) 1 for $O_3$ water cleaning, a transport path (T) 4b, a vapor phase growth chamber (Epi) 2, a transport path (T) 4c, an aftertreatment chamber (PostP) 3 for protecting the surface of an epitaxial wafer by a chemical silicon oxide film and a transport path (T) 4d are aligned in in-line arrangement in the order from the left-most transport path 4a to the right most side as viewed on the figure respectively through gate valves 6 interposed therebetween. The respective transport paths 4a, 4b, 4c, 4d are provided with handlers 5a, 5b, 5c, 5d which are wafer transfer means and a wafer can be transferred by a handler between adjacent chambers.

When atmosphere in the transport paths (T) are kept at a cleanliness level of class 10 according US federal standard 209B or at a higher cleanliness level, an epitaxial wafer which can be used for production of a 64 M DRAMs and a later generation more highly integrated semiconductor device can be produced.

Figure 2:
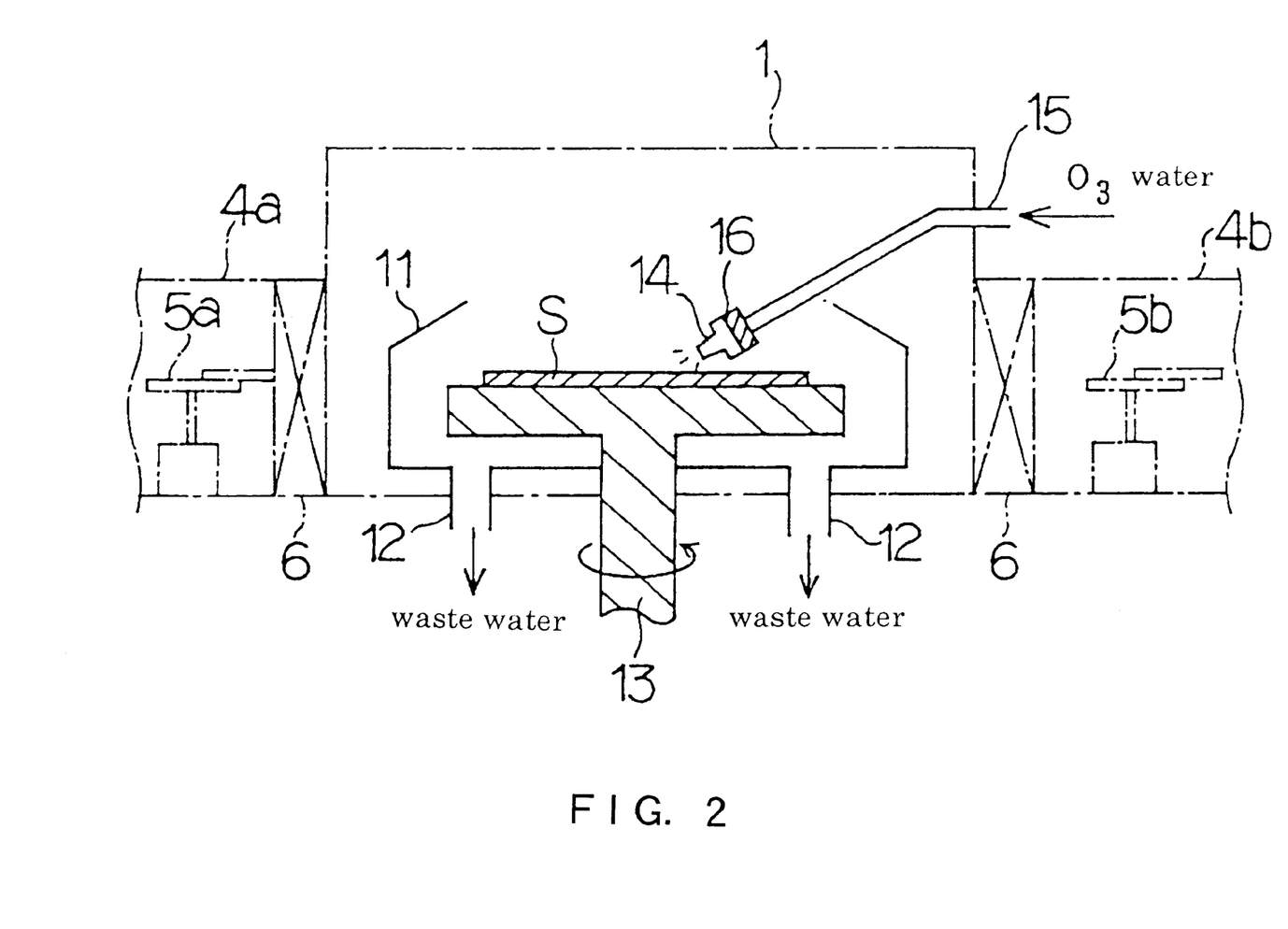
FIG. 2 is a schematic sectional view showing a structure example of the pretreatment chamber of FIG. 1 when a single wafer spin cleaning device is provided therein.

As the pretreatment chamber (PreP) 1, for example, a schematic sectional view of a chamber equipped with a single wafer spin cleaning device is shown in FIG. 2. In the single wafer spin cleaning device, a wafer stage 13 for holding a silicon single crystal wafer S which is mirror-polished is accommodated in the interior of a circular cleaning cup 11, a liquid supply pipe 15 for introducing $O_3$ water is arranged above the wafer stage 13 and a nozzle 14 is connected to the fore end of the liquid supply pipe 15. A supersonic vibrator plate 16 is built in the nozzle 14 and supersonic vibration in the megasonic band is applied to the $O_3$ added water just before discharge.

With such a construction, a silicon single crystal substrate S receives megasonic cleaning using the $O_3$ water supplied from the nozzle 14 while the wafer stage 13 is rotated by drive means, not shown. The overflowed $O_3$ water from the brim of the wafer stage 13 is discharged from a drain 12 which is formed through the bottom of the cleaning cup 11.

When the aftertreatment chamber (PostP) 3 is designed in the same way as the pretreatment chamber (PreP) 1 as well, an epitaxial wafer can be applied with megasonic cleaning using $O_3$ water. In the aftertreatment chamber 3, the nozzle 14 is allowed not to necessarily include the supersonic vibrator plate 16 therein.

On the other hand, when the SC1 cleaning is performed in the aftertreatment chamber 3, an ammonia-hydrogen peroxide mixed solution can be introduced through the liquid supply pipe 15.

Example 2

In the example, as another example of a semiconductor producing apparatus, an pretreatment chamber, a vapor phase growth chamber and an aftertreatment chamber are aligned along one long straight transport path and such a construction will be described with reference to FIG. 3.

Figure 3:
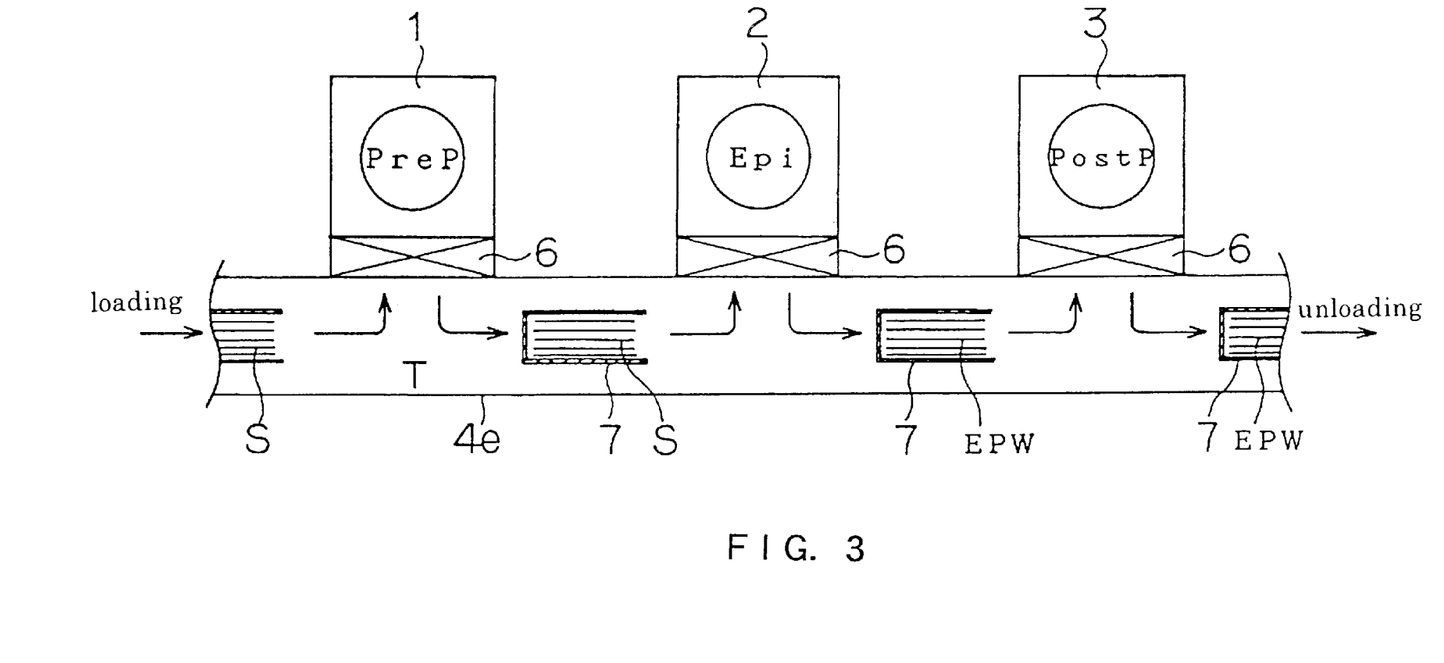
FIG. 3 is a schematic plan view showing a construction example of another semiconductor producing apparatus of the invention in which a pretreatment chamber, a vapor phase growth chamber and an aftertreatment chamber are connected by one long transport path provided along them.

In the construction of FIG. 3, the pretreatment chamber (PreP) 1, the vapor phase growth chamber (Epi) 2 and the aftertreatment chamber (PostP) 3 are arranged in the order from the left-most pretreatment chamber (OreP) 1 to the aftertreatment chamber (PostP) 3 in the right side along a long side of the one long transport path 4c while the chambers are respectively connected to the transport path 4c by gate valves 6. A silicon single crystal substrate S or an epitaxial wafer EPW are transferred by wafer transfer means, not shown, between the chambers while wafers are inserted in a wafer cassette 7.

While in FIG. 3, it is imagined that batch treatments are respectively conducted in the chambers and it is shown that a plurality of wafers are as a whole transported using the cassette 7, when single wafer treatments are respectively conducted in the chambers, the handlers as shown in FIG. 1 are respectively provided at a plurality of sites along the transport path 4c and the wafers may be transferred by each of the handlers one at a time between the chambers.

In addition, in the construction of FIG. 3, the chambers are arranged on one side of the long transport path 4c, but the chambers can be alternately arranged on both sides of the transport path 4c.

Example 3

In the example, a construction of the apparatus, as still another example of a semiconductor producing apparatus of the invention, will be described with reference to FIG. 4 in which a pretreatment chamber, a vapor phase growth chamber, an aftertreatment chamber and load lock chambers for loading/unloading a wafer are arranged along the periphery of one transport path in such a manner that the chambers are radially aligned about a center.

Figure 4:
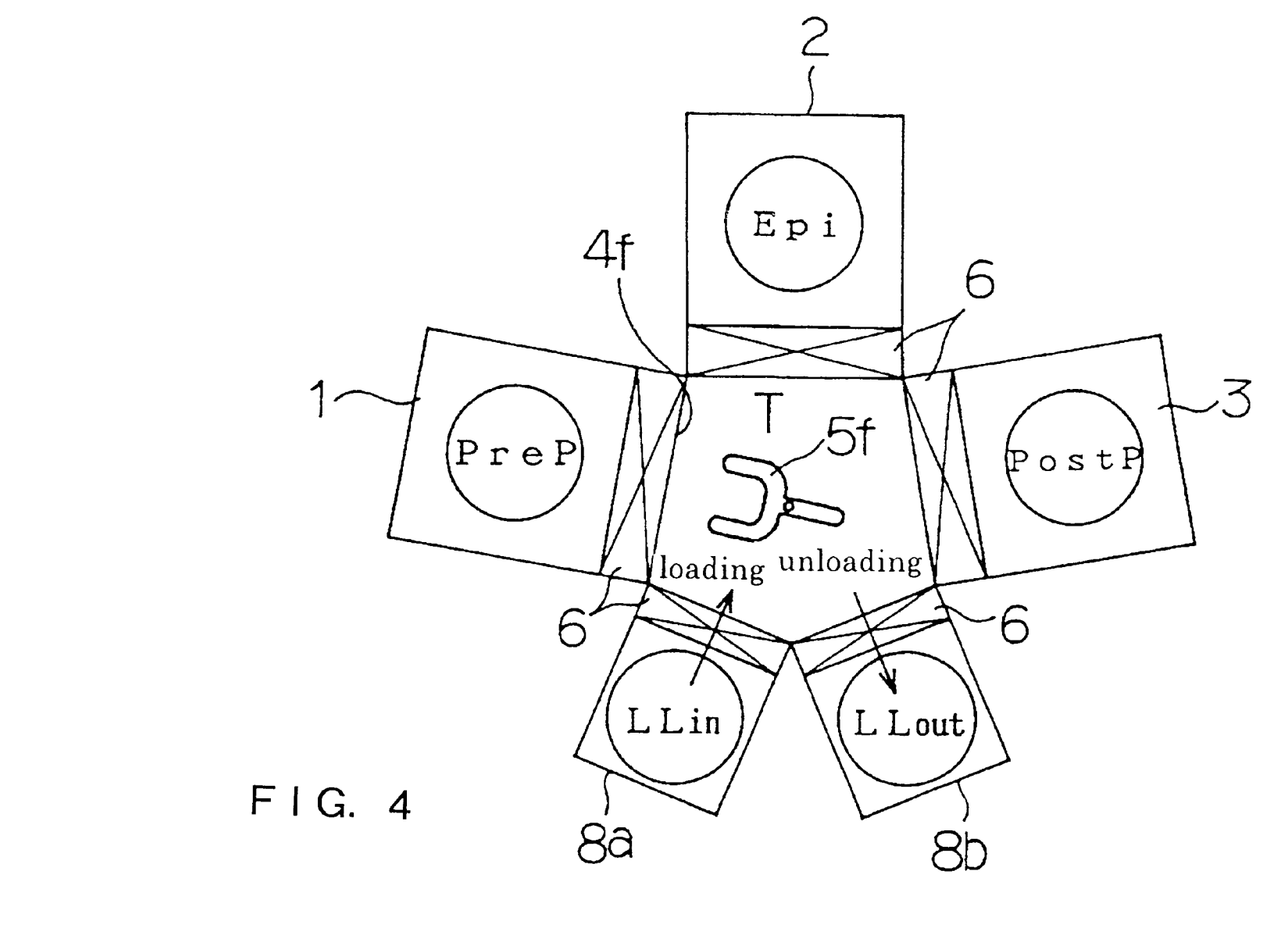
FIG. 4 is a schematic plan view showing a construction example of still another semiconductor producing apparatus of the invention in which a pretreatment chamber, a vapor phase growth chamber, an aftertreatment chamber and load lock chambers are each connected to one side of a polygonal transport path in such a manner that the chambers and load locks are radially aligned about a center.

In the construction of FIG. 4, the load lock chamber (LLin) 8a for loading a wafer, the pretreatment chamber (PreP) 1, the vapor phase growth chamber (Epi) 2, the aftertreatment chamber (PostP) 3 and the load lock chamber (LLout) 8b for unloading a wafer are arranged in this order clockwise along respective sides of the transport path(T) 4f of a pentagonal shape and the chambers are respectively connected to the transport path 4f through the gate valves 6. A silicon single crystal substrate S or an epitaxial wafer EPW are transferred between the chambers by a handler 5f which is provided for the transport path 4f.

This is a construction which is designed for a single wafer treatment as a precondition and sometimes called a multi-chamber or a cluster tool as well. That is, a cassette in which a plurality of silicon single crystal substrates S are accommodated is loaded into the load lock chamber (LLin) 8a, the silicon single crystal substrates S are taken out from the cassette one at a time, sent to the adjacent chamber and then to the further adjacent chambers, while predetermined processings are, in parallel to this operation, sequentially performed on each wafer, epitaxial wafers which are produced at the last stage are accommodated in a wafer cassette in the load lock chamber (LLout) 8b, and when a plurality of epitaxial wafers are accumulated, the wafer cassette is unloaded.

Example 4

Figure 5:
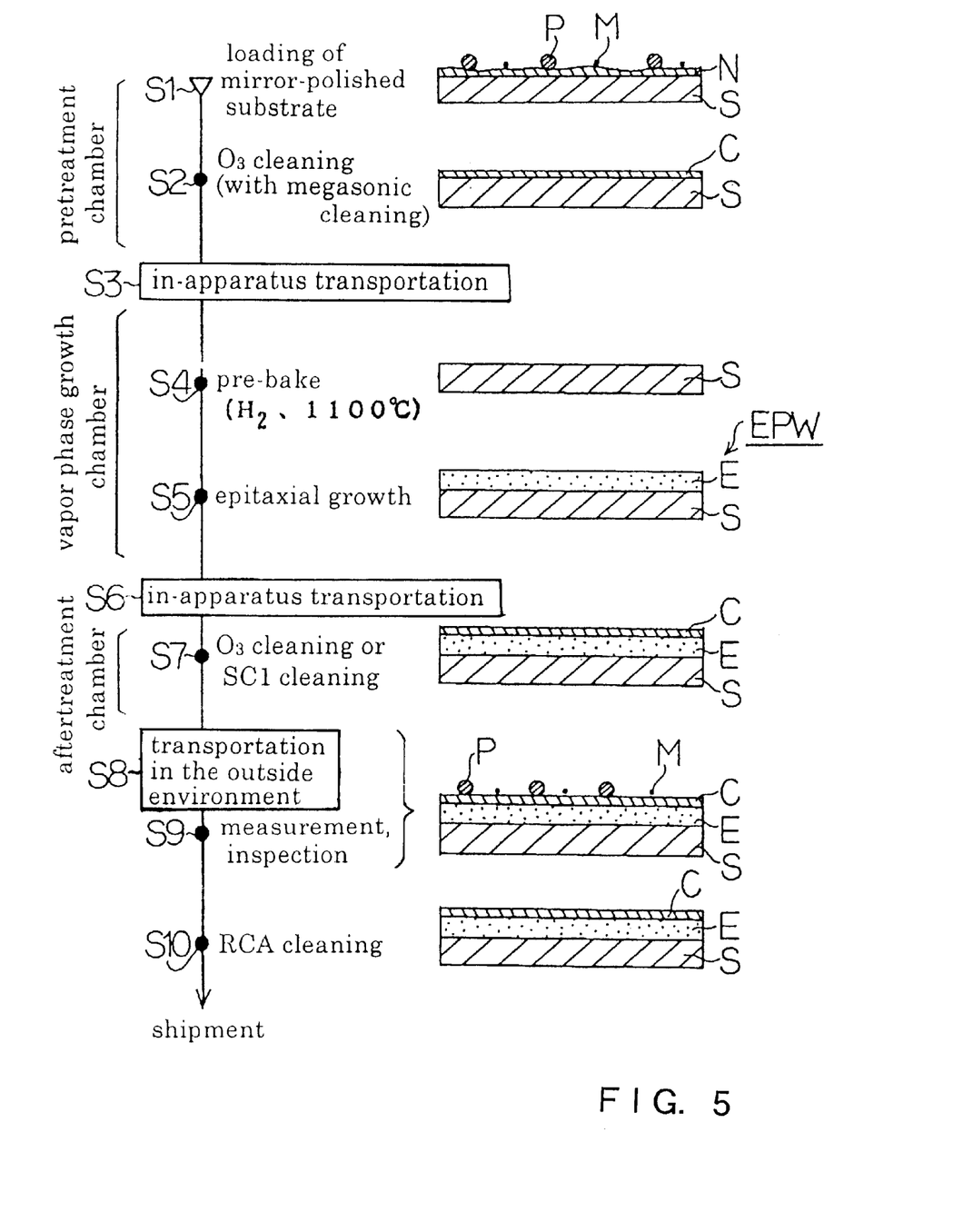
FIG. 5 is a flow chart showing a fundamental procedure of a producing method for an epitaxial wafer of the invention.

In the example, a process in which an epitaxial wafer is produced using each of the above described semiconductor producing apparatuses will be described with reference to FIG. 5.

A p-type silicon single crystal substrate S with a diameter of 200 mm on which a natural oxide film N is formed after mirror-polishing in step S1, is loaded into the pretreatment chamber 1. At this stage, there is a possibility that fine silicon based particles P and fine metal particles M are already attached on the surface of the silicon single crystal substrate S.

Then, in step S2, megasonic cleaning is conducted in the chamber using $O_3$ water of a concentration 7 ppm. At this point, not only the fine silicon based particles P and the fine metal particles M are efficiently removed, but a chemical silicon oxide film C is also formed on a surface of the silicon single crystal substrate S.

Then, in step S3, in-apparatus transportation is conducted and the silicon single crystal substrate S is loaded into the vapor phase growth chamber 2. Since this in-apparatus transportation is conducted in the transport path 4b of FIG. 1, the transport path 4e of FIG. 3 or the transport path 4f of FIG. 4, almost no foreign matter is attached on a wafer surface.

Then, in step S4, pre-bake is conducted in a hydrogen atmosphere at 1130° C. for 45 seconds. The chemical silicon oxide film C is removed by a high temperature reductive atmosphere in the pre-bake and thereby a clean Si surface is revealed.

Then, in step S5, a p-type silicon epitaxial layer E of a thickness of 15 μm is grown in vapor phase growth to obtain an epitaxial wafer EPW. At this point, since the epitaxial growth progresses on a highly cleansed Si surface, the obtained epitaxial layer is in a good state in which not only excellent flatness but a uniform thickness are realized, and almost neither projected defects nor stacking faults are recognized.

Then, in step S6, in-apparatus transportation is further conducted and an epitaxial wafer EPW is loaded into the aftertreatment chamber 3. Since the in-apparatus transportation is conducted in the interior of the transport path 4c of FIG. 1, the transport path 4e of FIG. 3, or the transport path 4F of FIG. 4, all of which are each kept at a cleanliness level of class 10 or at a higher cleanliness level in the interior, almost no foreign matter gets attached on a wafer surface.

Then, in step S7, a chemical silicon oxide film C is immediately formed on the surface of the silicon epitaxial layer E to a thickness of about 1 nm using $O_3$ water of a concentration of 7 ppm or an ammonia-hydrogen peroxide mixed solution with a mixing ratio of 29% by wt $NH_3$:30% by wt $H_2O_2$:$H_2O$=1:1:5 in volume.

Then, in step S8, the epitaxial wafer EPW is transported to a later step in the outside environment. This outside transportation corresponds to transportation in unloading the epitaxial wafer EPW from the transport path 4d in FIG. 1, transportation in taking out the wafer cassette 7 from the transport path 4e in FIG. 3 or transportation in unloading the wafer cassette 7, not shown, from the load lock chamber (LLout) 8b in FIG. 4.

The epitaxial wafer EPW which is passivated by the chemical silicon oxide film C is sequentially subjected to film thickness measurement, flatness measurement and visual inspection in step S9 which comes after the step S7. Though fine silicon based particles P and fine metal particles M have chances to be attached on the surface thereof in the step S9, the particles are eliminated by RCA cleaning in step S10 which comes after the step S9, since the particles have a weak attaching force on the chemical silicon oxide film C. That is, since fine metal particles M is not attached directly on the silicon epitaxial layer E though the attachment conventionally occurs, there arises no oxidation-reduction reaction between a metal and Si. Hence, there is no risks for pits to arise on the silicon epitaxial layer E.

While the invention is described based on the 4 examples as above, the invention is not limited to the examples.

For example, while a chamber with the single wafer spin cleaning device is shown in FIG. 2 as the pretreatment chamber in which $O_3$ water cleaning is performed, the single wafer spin cleaning device may be replaced with a batch cleaning device. When the batch cleaning device is used, $O_3$ added water is prepared by supplying $O_3$ through a gas distributor provided on the bottom of a cleaning vessel filled up with ultrapure water thereinto and a plurality of silicon single crystal substrates S accommodated in a proper carrier are immersed as a whole in thus prepared $O_3$ added water while the wafers are kept at standing positions. However, in such a construction of device, since formation of a chemical silicon oxide film on a wafer gets started from a surface part of a silicon single crystal substrate S located at a position closest to the gas distributor and then gradually propagated toward a second surface part of the silicon single crystal substrate at a position farther than the closest position, a cleaning time has to be set in consideration of such circumstances to obtain a silicon single crystal substrate S which is perfectly covered across the entire surface.

Other details, such as combination of a single wafer treatment and a batch treatment in each of chambers and the like, can be subjected to modifications, selections and combinations in a proper manner.

What is claimed is:

1. A producing method for an epitaxial wafer comprising the steps of cleaning a surface of a silicon wafer with ozone added water in a pretreatment chamber;

transporting the silicon wafer from the pretreatment chamber to a vapor phase growth chamber though a transport path whose interior is controlled to have an atmosphere isolated from the outside environment;

growing a silicon epitaxial layer on the silicon wafer in the vapor phase growth chamber to obtain an epitaxial wafer;

transporting the epitaxial wafer from the vapor phase growth chamber to an aftertreatment chamber through a transport path whose interior is controlled to have an atmosphere isolated from the outside environment; and forming a chemical silicon oxide film on a surface of the silicon epitaxial layer in the aftertreatment chamber.

2. A producing method for an epitaxial wafer according to claim 1, wherein in the first step of cleaning the surface of a silicon wafer, the silicon wafer is cleaned with the ozone added water while applying supersonic vibration.

3. A producing method for an epitaxial wafer according to claim 1, where in the step of forming a chemical silicon oxide film, the chemical silicon oxide film is formed by putting the silicon epitaxial layer into contact with a solution including an oxidizing agent.

4. A producing method for an epitaxial wafer according to claim 3, wherein ozone added water or an ammonia-hydrogen peroxide mixed solution is used as the solution.

5. A producing method for an epitaxial wafer according to claim 1, wherein the atmosphere in a transport path is kept at a cleanliness level of class 10 or higher.

* * * * *